(12) United States Patent
Park et al.

(10) Patent No.: US 7,454,185 B2
(45) Date of Patent: Nov. 18, 2008

(54) WIDEBAND I/Q SIGNAL GENERATION DEVICE

(75) Inventors: Yun-Seo Park, Atlanta, GA (US);
Sang-Hyun Woo, Seoul (KR);
Hwan-Seok Song, Suwon-si (KR);
Seong-Soo Lee, Suwon-si (KR);
Chang-Ho Lee, Marietta, GA (US); Joy Laskar, Atlanta, GA (US)

(73) Assignees: Samsung Electronics Co., Ltd. (KR);
Georgia Tech Research Corporation, Atlanta, GA (US)

( * ) Notice: Subject to any disclaimer, the term of this patent is extended or adjusted under 35 U.S.C. 154(b) by 431 days.

(21) Appl. No.: 11/089,219

(22) Filed: Mar. 24, 2005

(65) Prior Publication Data

US 2005/0245225 A1 Nov. 3, 2005

Related U.S. Application Data

(60) Provisional application No. 60/555,712, filed on Mar. 24, 2004.

(30) Foreign Application Priority Data

Dec. 31, 2004 (KR) ........................ 10-2004-0118151

(51) Int. Cl.
*H04B 1/10* (2006.01)

(52) U.S. Cl. .................... 455/302; 455/283; 455/183.1; 455/307

(58) Field of Classification Search .............. 455/180.3, 455/183.1, 296, 283, 307, 323, 333, 334, 455/288, 289, 293
See application file for complete search history.

(56) References Cited

U.S. PATENT DOCUMENTS 6,560,449 B1 * 5/2003 Liu ............................ 455/302

* cited by examiner

*Primary Examiner*—Blane J Jackson
(74) *Attorney, Agent, or Firm*—McNeely Bodendorf LLP

(57) ABSTRACT

An apparatus for generating an in-phase/quadrature-phase (I/Q) signal in a wireless transceiver is disclosed, including a local oscillator for generating an oscillation signal, and first and second mixers for mixing an oscillation signal with a transmission/reception signal to convert the transmission/reception signal into a baseband or high-frequency signal. The apparatus includes a phase locked circuit for controlling the local oscillator, and a polyphase filter installed between the local oscillator and the mixers, for separating the oscillation signal from the local oscillator into an I signal and a Q signal depending on a control signal from the phase locked circuit, and outputting the separated I and Q signals to the first and second mixers, respectively.

14 Claims, 6 Drawing Sheets

WIDEBAND I/Q SIGNAL GENERATION DEVICE

PRIORITY

This application claims priority under 35 U.S.C. § 119 to an application entitled "Improved Wideband I/Q Signal Generation Technique" filed in the United States Patent and Trademark Office on Mar. 24, 2004 and assigned Ser. No. 60/555,712, and an application entitled "Improved Wideband I/Q Signal Generation Technique" filed in the Korean Intellectual Property Office on Dec. 31, 2004 and assigned Ser. No. 2004-118151, the contents of both of which are incorporated herein by reference.

BACKGROUND OF THE INVENTION

1. Field of the Invention

The present invention relates generally to a wireless communication system, and in particular, to an improved in-phase/quadrature-phase (I/Q) signal generation device for a wireless communication system.

2. Description of the Related Art

Due to the increasing of wireless communication equipment together with the wide spread user of wireless communications, attempts have been made to integrate the constituent elements of a transceiving device have a on one chip for miniaturization, low power consumption and low price. The constituent elements require reference signals of in-phase (I) and quadrature-phase (Q).

In a communication system using an orthogonal channel, I and Q channels are orthogonal to each other, but orthogonality therebetween is lost due to a defect caused when an element such as an oscillator is implemented. Therefore, a gain and a phase are unbalanced and a direct current (DC) error is caused, thereby deteriorating performance of the communication system.

A direct conversion receiver (DCR) technique is essentially required in a current environment where a variety of wireless communication standards coexist. In a conventional heterodyne receiver, a signal is amplified at 50 dB to 60 dB before its I/Q separation, and therefore, lower-gain amplification is required. Accordingly, a mismatching problem is considerable. Unlike this, in a DCR receiver, an input signal is amplified at 10 dB to 20 dB before its I/Q separation, and therefore, higher-gain amplification is required. Accordingly, an I/Q mismatching problem should be fully considered when designing a receiver.

FIG. 1 is a diagram illustrating a conventional DCR-based I/Q signal generation circuit. As shown in FIG. 1, an input signal is band-pass-filtered by a band-pass filter 101 and then amplified by a low noise amplifier 102. The amplified signal is mixed in mixers 104 and 106, which are separately installed on two signal lines with a local oscillation signal from a local oscillator 103. The mixed signals are output as I/Q signals through low-pass filters 107 and 108 and power amplifiers 109 and 110. The local oscillation signal is output to the mixer 106 for the Q signal, and is shifted 90° by a phase shifter 105 before being output to the mixer 104 for the I signal.

FIGS. 2A and 2B are graphs illustrating gain mismatching between the local oscillator and the phase shifter, and FIGS. 2C and 2D are graphs illustrating phase mismatching between the local oscillator and the phase shifter. It can be appreciated that the original signal points are distorted toward an I-axis and a Q-axis in a signal constellation.

In order to solve the mismatching problem, a frequency divider is generally used in a conventional oscillator. The frequency divider is being widely used even in a DCR system requiring an oscillation frequency different from a reference frequency. However, in an I/Q matching scheme using the frequency divider, if an input signal includes second harmonics, its I/Q signals suffer considerable phase mismatching, causing high power consumption and a difficulty in generating and separating high frequencies.

As another I/Q matching method, there is a known method using a resistor-capacitor (RC) polyphase filter. This can be used only for narrow-range control due to its high I/Q mismatching, and should be used together with a limiter to reduce the gain mismatching. This method is disadvantageous in that the RC polyphase filter reduces I/Q signal power.

SUMMARY OF THE INVENTION

It is, therefore, an object of the present invention to provide an improved I/Q signal generation device for minimizing in-phase/quadrature-phase (I/Q) mismatching and providing a wide control range of oscillation frequency.

It is another object of the present invention is to provide an improved I/Q signal generation device capable of preventing performance deterioration caused by a phase noise of an oscillator.

It is a further object of the present invention is to provide an improved I/Q signal generation device capable of controlling multiphase signals using one phase locked loop (PLL) without experiencing performance deterioration of a voltage controlled oscillator.

It is further another object of the present invention is to provide an improved I/Q signal generation device miniaturized by removing a limiter used in a conventional polyphase filter.

To achieve the above and other objects, there is provided an apparatus for generating an in-phase/quadrature-phase (I/Q) signal in a wireless transceiver including a local oscillator for generating an oscillation signal, and first and second mixers for mixing an oscillation signal with a transmission/reception signal to convert a transmission/reception signal into a baseband or high-frequency signal, the apparatus including a phase locked circuit for controlling the local oscillator; and a polyphase filter installed between the local oscillator and the mixers, for separating the oscillation signal from the local oscillator into an I signal and a Q signal based on a control signal from the phase locked circuit, and outputting the separated I and Q signals to the first and second mixers, respectively.

BRIEF DESCRIPTION OF THE DRAWINGS

The above and other objects, features and advantages of the present invention will become apparent from the following detailed description when taken in conjunction with the accompanying drawings in which.

DETAILED DESCRIPTION OF THE PREFERRED EMBODIMENT

A preferred embodiment of the present invention will now be described in detail with reference to the annexed drawings. In the following description, a detailed description of known functions and configurations incorporated herein has been omitted for conciseness.

Figure 1:
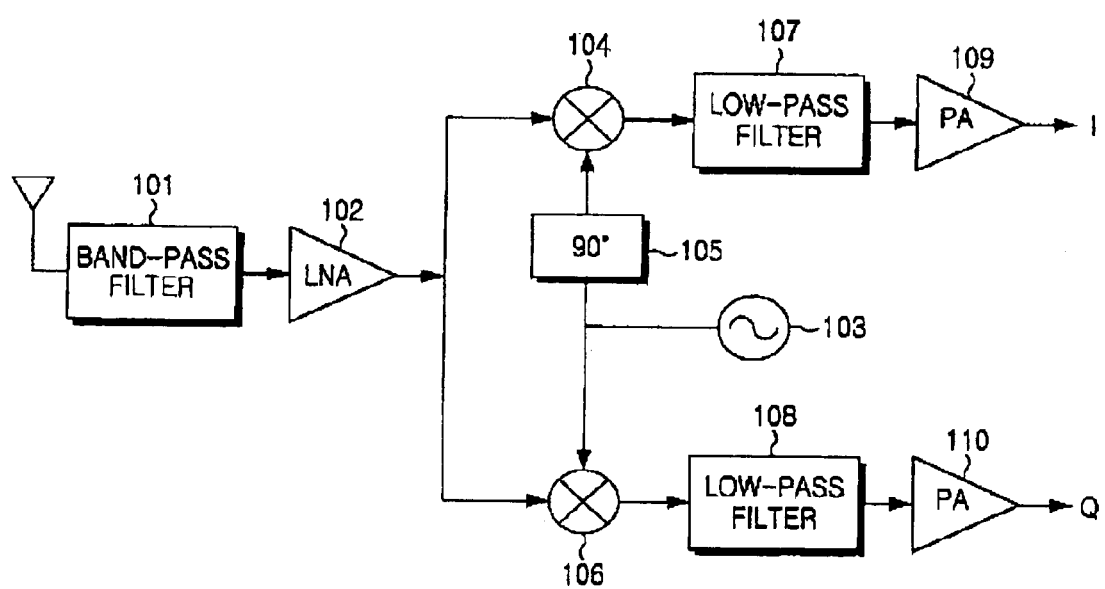
FIG. 1 is a diagram illustrating a conventional DCR-based I/Q signal generation circuit.
Figure 2A:
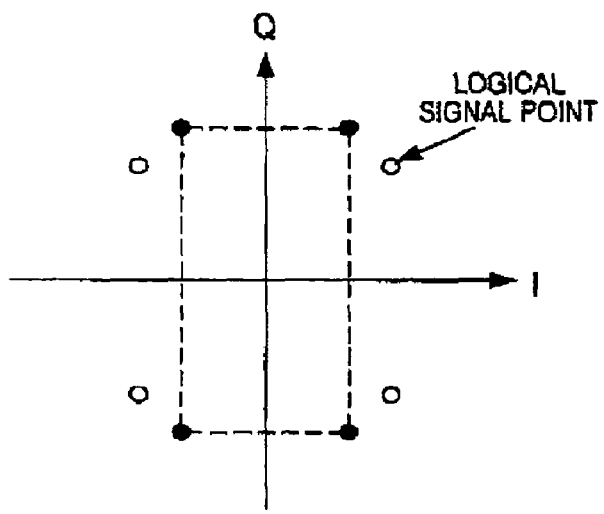
FIGS. 2A and 2B are graphs illustrating gain mismatching between a local oscillator and a phase shifter in a conventional I/Q signal generation circuit.
Figure 2B:
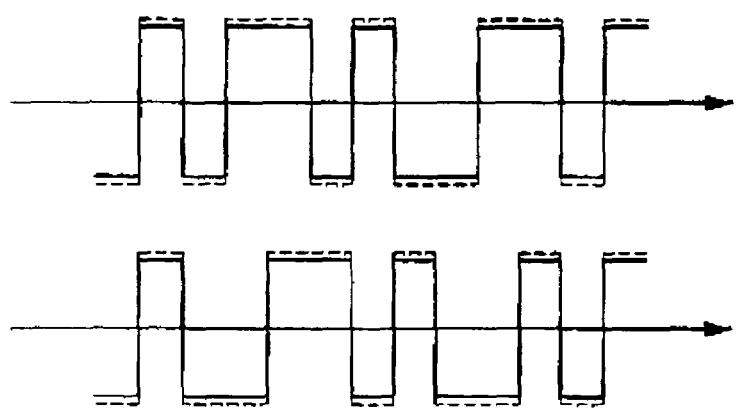
Figure 2C:
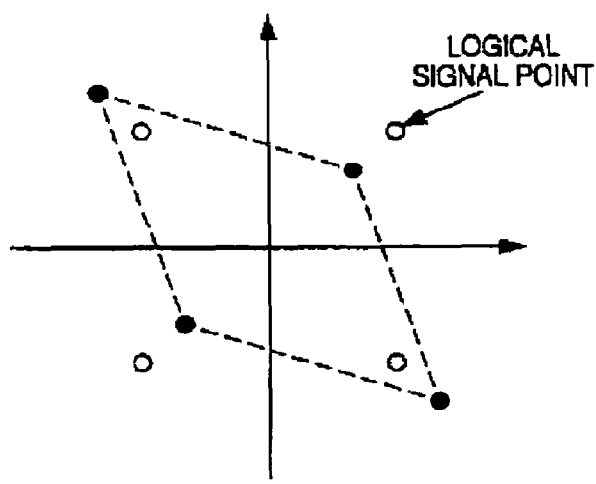
FIGS. 2C and 2D are graphs illustrating phase mismatching between the local oscillator and the phase shifter in the conventional I/Q signal generation circuit.
Figure 2D:
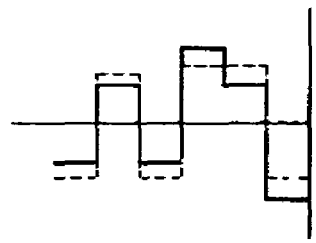
Figure 2D:
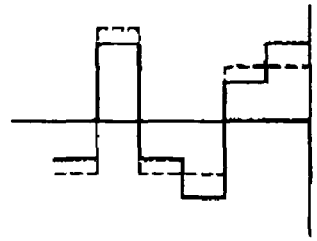
Figure 3:
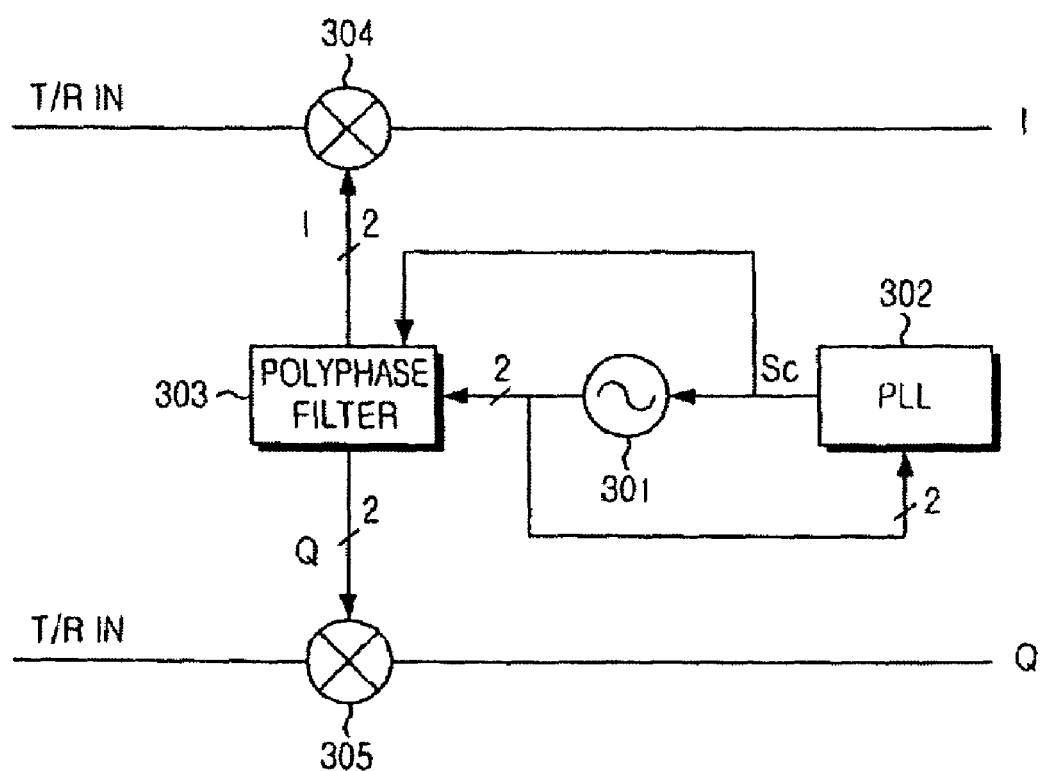
FIG. 3 is a block diagram illustrating an I/Q signal generation device according to a preferred embodiment of the present invention.

FIG. 3 is a block diagram illustrating an in-phase/quadrature-phase (I/Q) signal generation device according to a preferred embodiment of the present invention. As shown in FIG. 3, the inventive I/Q signal generation device includes a local oscillator 301 for generating a local oscillation signal, a phase locked loop (PLL) 302 for controlling a frequency of the local oscillation signal of the local oscillator 301, a polyphase filter 303 connected to an output terminal of the local oscillator 301 to output I and Q signals, a first mixer 304 disposed on an I path to mix the I signal with a transmission/reception signal T/R IN, and a second mixer 305 disposed on a Q path to mix the Q signal with the transmission/reception signal T/R IN. The PLL 302 compares the oscillation signal from the local oscillator 301 with a reference signal, and outputs a control signal $S_c$ based on the comparison result to the local oscillator 301 and the polyphase filter 303.

Figure 4:
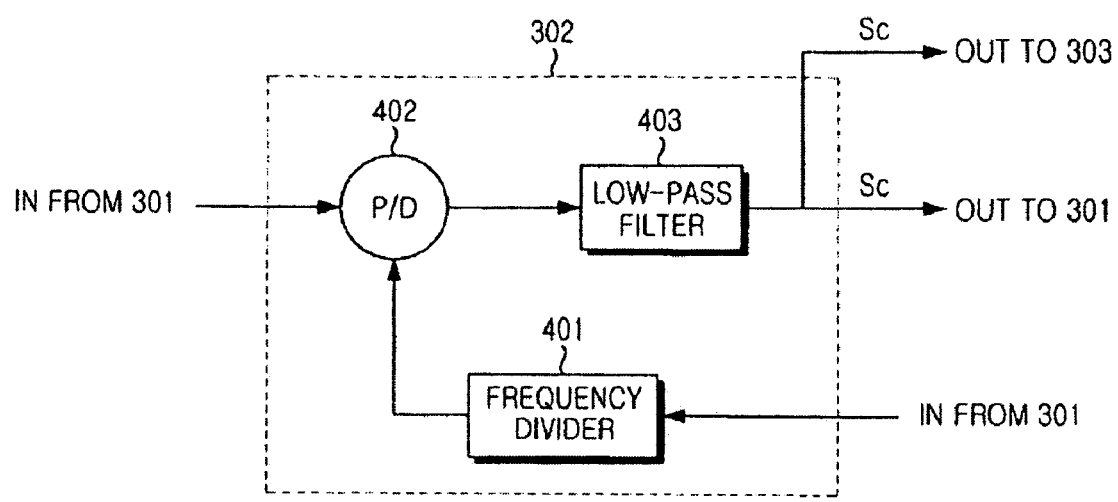
FIG. 4 is a block diagram illustrating a construction of the phase locked loop (PLL) of FIG. 3.

FIG. 4 is a block diagram illustrating a construction of the PLL 302 of FIG. 3. As shown in FIG. 4, the PLL 302 includes a frequency divider 401 for dividing a frequency of the oscillation signal from the local oscillator 301, a phase detector (P/D) 402 for receiving the oscillation signal from the local oscillator 301, and an output signal of the frequency divider 401 as a reference signal, and detecting phases of the received signals, and a low-pass filter 403 for low-pass-filtering an output signal of the phase detector 402 to generate the control signal $S_c$. The generated control signal $S_c$ is output to the local oscillator 301 and the polyphase filter 303.

Figure 5:
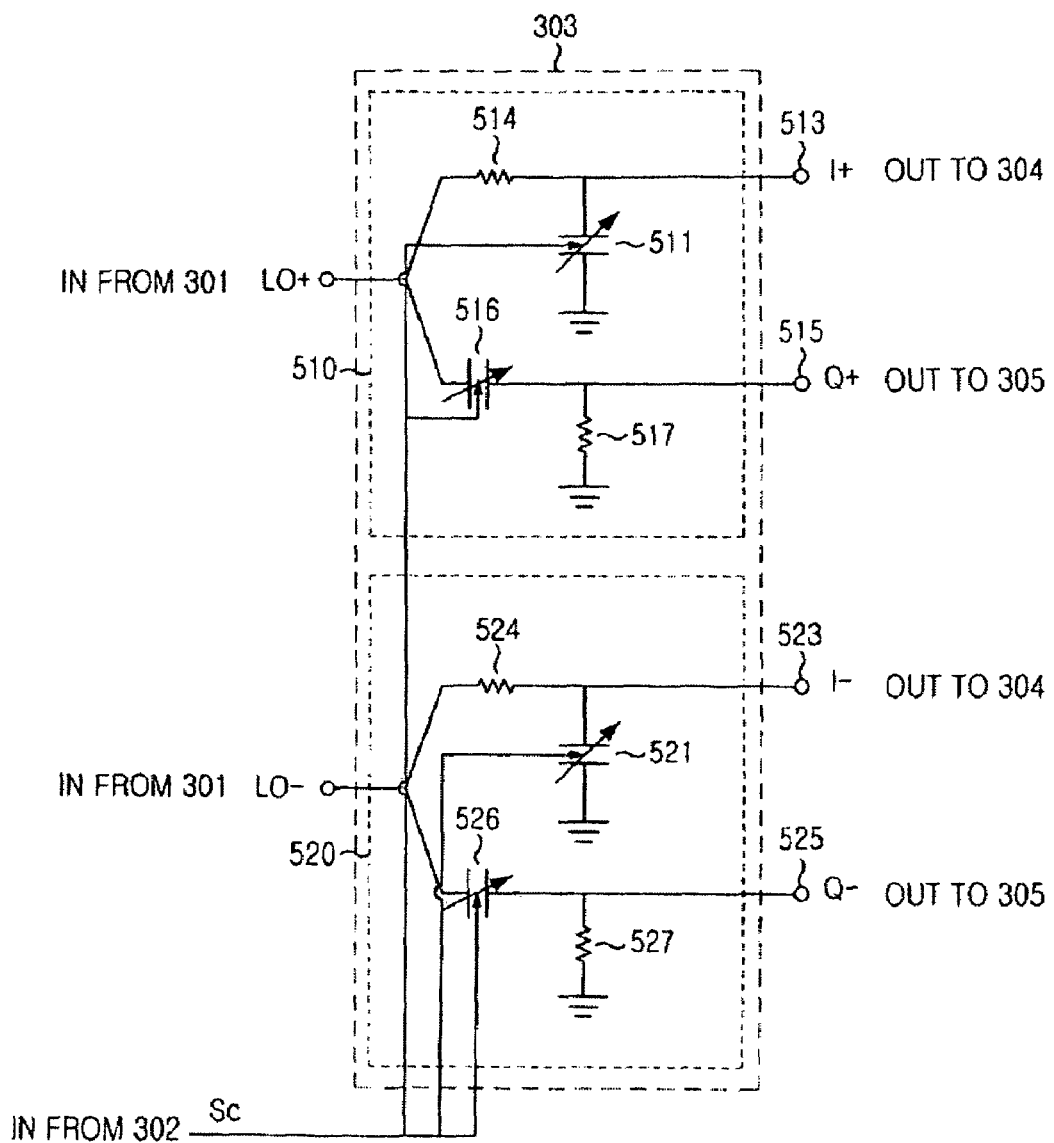
FIG. 5 is a block diagram illustrating a construction of the polyphase filter of FIG. 3.

FIG. 5 is a block diagram illustrating a construction of the polyphase filter 303 of FIG. 3. As shown in FIG. 5, the polyphase filter 303 is comprised of first and second variable filters 510 and 520 for frequency up-conversion and frequency down-conversion, respectively. The first variable filter 510 and separates the oscillation signal of the local oscillator 301 into an I signal and a Q signal. The first variable filter 510 includes a first varactor 511 connected between the ground and a first output terminal 513, and a first resistor 514 connected in series between an input terminal LO+ and the first output terminal 513. Further, the first variable filter 510 includes a second varactor 516 connected in series between a second output terminal 515 and the input terminal LO+, and a second resistor 517 connected between the ground and the second output terminal 515.

Similarly, the second variable filter 520 separates the oscillation signal of the local oscillator 301 into an I signal and a Q signal. The second variable filter 520 includes a third varactor 521 connected between the ground and a third output terminal 523, and a third resistor 524 connected in series between an input terminal LO− and the third output terminal 523. Further, the second variable filter 520 includes a fourth varactor 526 connected in series between a fourth output terminal 525 and the input terminal LO−, and a fourth resistor 527 connected between the ground and the fourth output terminal 525.

The first to fourth varactors 511, 516, 521 and 526 are controlled by the control signal $S_C$ output from the low-pass filter 402. The varactors 511, 516, 521 and 526 are installed in the polyphase filter 303 to control their electrostatic capacitances based on the control signal Sc of the PLL 302, thereby effectively reducing the I/Q mismatching caused by a frequency variation.

As described above, in the inventive I/Q signal generation device, the varactors being variable capacitors are installed in the polyphase filter, and the varactors are controlled based on the control signal of the PLL to effectively reduce the I/Q mismatching caused by a variation in oscillation frequency.

The inventive I/Q signal generation device uses the varactors to minimize the I/Q mismatching and control the oscillation frequency over a wide range. Moreover, the inventive I/Q signal generation device generates exact I/Q signals using the varactors, thereby preventing performance deterioration caused by a phase noise from the local oscillator. The inventive I/Q signal generation device contributes to miniaturization of a transceiving device by removing a limiter used in a conventional polyphase filter.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. An apparatus for generating an in-phase/quadrature-phase (I/Q) signal in a wireless transceiver including a local oscillator for generating an oscillation signal, and first and second mixers for mixing an oscillation signal with a transmission/reception signal to convert the transmission/reception signal into a baseband or high-frequency signal, comprising:
   a phase locked loop for controlling the local oscillator; and
   a polyphase filter installed between the local oscillator and the mixers, for separating the oscillation signal from the local oscillator into an I signal and a Q signal based on a control signal from the phase locked loop, and outputting the separated I and Q signals to the first and second mixers, respectively, so as to be mixed with the transmission/reception signal.

2. The apparatus of claim 1, wherein the phase locked circuit comprises:
   a frequency divider for dividing a frequency of the oscillation signal from the local oscillator;
   a phase detector for detecting phases of output signals of the frequency divider and the local oscillator; and
   a low-pass filter for filtering an output signal of the phase detector and outputting the control signal to the local oscillator and the polyphase filter.

3. The apparatus of claim 1, wherein the polyphase filter comprises first and second variable filters for filtering the oscillation signal from the local oscillator based on the control signal of the phase locked loop and outputting the filtered signal to the first and second mixers.

4. The apparatus of claim 3, wherein the first variable filter separates the oscillation signal for up-conversion of a transmission signal into an I signal and a Q signal and outputs the separated I signal and Q signal to the first and second mixers, respectively.

5. The apparatus of claim 3, wherein the second variable filter separates the oscillation signal for down-conversion of a reception signal into an I signal and a Q signal and outputs the separated I signal and Q signal to the first and second mixers, respectively.

6. The apparatus of claim 3, wherein the first variable filter separates the oscillation signal for up-conversion of a transmission signal into an I signal and a Q signal and outputs the separated I signal and Q signal to the first and second mixers, respectively, wherein the second variable filter separates the oscillation signal for down-conversion of a reception signal into an I signal and a Q signal and outputs the separated I signal and Q signal to the first and second mixers, respectively.

7. The apparatus of claim 6, wherein the first variable filter comprises a varactor connected between the ground and an output line connected to the first mixer, said varactor controlled by the control signal from the phase locked loop.

8. The apparatus of claim 6, wherein the first variable filter comprises a varactor connected in series to an output line connected to the second mixer, said varactor controlled by the control signal from the phase locked loop.

9. The apparatus of claim 6, wherein the first variable filter comprises a first varactor connected between the ground and an output line connected to the first mixer, and a second varactor connected in series to an output line connected to the second mixer, the first and second varactors controlled by the control signal from the phase locked loop.

10. The apparatus of claim 6, wherein the second variable filter comprises a varactor connected between the ground and an output line connected to the first mixer, said varactor controlled by the control signal from the phase locked loop.

11. The apparatus of claim 6, wherein the second variable filter comprises a varactor connected in series to an output line connected to the second mixer, said varactor controlled by the control signal of the phase locked loop.

12. The apparatus of claim 6, wherein the second variable filter comprises a first varactor connected between the ground and an output line connected to the first mixer, and a second varactor connected in series to an output line connected to the second mixer, the first and second varactors controlled by the control signal from the phase locked loop.

13. The apparatus of claim 6, wherein the first variable filter comprises a first varactor connected between the ground and an output line connected to the first mixer, and a second varactor connected in series to an output line connected to the second mixer, wherein the second variable filter comprises a third varactor connected between the ground and the output line connected to the first mixer, and a fourth varactor connected in series to the output line connected to the second mixer, the first to fourth varactors operating controlled by the control signal of the phase locked loop.

14. The apparatus of claim 13, wherein each of the first and second variable filters comprises a first resistor connected in series with the output line connected to the first mixer, and a second resistor connected between the ground and the output line connected to the second mixer.

* * * * *